United States Patent
Joo (10) Patent No.: US 8,735,961 B2
(45) Date of Patent: May 27, 2014

(54) 3D NON-VOLATILE MEMORY DEVICE AND METHOD FOR FABRICATING THE SAME

(75) Inventor: Han-Soo Joo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 628 days.

(21) Appl. No.: 12/881,635

(22) Filed: Sep. 14, 2010

(65) Prior Publication Data

US 2011/0062510 A1 Mar. 17, 2011

(30) Foreign Application Priority Data

Sep. 14, 2009 (KR) ........................ 10-2009-0086580

(51) Int. Cl.
*H01L 29/66* (2006.01)
(52) U.S. Cl.
USPC ..... 257/319; 257/324; 257/326; 257/E29.309
(58) Field of Classification Search
CPC ................... H01L 27/11578; H01L 27/11582
USPC ................. 257/319, 366, 314, 316, 324, 326, 257/E29.309
See application file for complete search history.

(56) References Cited

U.S. PATENT DOCUMENTS

2007/0158736 A1 * 7/2007 Arai et al. ..................... 257/315

FOREIGN PATENT DOCUMENTS

| JP | 2007-317874 | 12/2007 |
|---|---|---|
| KR | 1020080027162 | 3/2008 |
| KR | 1020100020435 | 2/2010 |
| WO | WO2009/075370 | 6/2009 |

OTHER PUBLICATIONS

Notice of Allowance issued by the Korean Intellectual Property Office on Apr. 18, 2012.
Notice of Preliminary Rejection issued from Korean Intellectual Property Office on Aug. 8, 2011.

* cited by examiner

*Primary Examiner* — Kenneth Parker
*Assistant Examiner* — Jose R Diaz
(74) *Attorney, Agent, or Firm* — IP & T Group LLP

(57) ABSTRACT

A non-volatile memory device having a string of a plurality of memory cells that are serially coupled, wherein the string of memory cells includes a plurality of second channels of a pillar type, a first channel coupling lower end portions of the plurality of the second channels with each other, and a plurality of control gate electrodes surrounding the plurality of the second channels.

10 Claims, 9 Drawing Sheets

3D NON-VOLATILE MEMORY DEVICE AND METHOD FOR FABRICATING THE SAME

CROSS-REFERENCE TO RELATED APPLICATIONS

The present application claims priority of Korean Patent Application No. 10-2009-0086580, filed on Sep. 14, 2009, which is incorporated herein by reference in its entirety.

BACKGROUND OF THE INVENTION

Exemplary embodiments of the present invention relate to a semiconductor memory device and a fabrication method thereof, and more particularly, to a non-volatile memory device having a three-dimensional (3D) structure, and a method for fabricating the non-volatile memory device.

A non-volatile memory device is a memory device which stores data even if power supply is cut off. As the integration degree of a two-dimensional memory device, which is fabricated in the form of layers over a silicon substrate, is reaching limits, a non-volatile memory device having a 3D structure in which memory cells are stacked vertically from a silicon substrate have been developed.

Hereafter, a structure of a conventional 3D non-volatile memory device and related concerns will be described in detail with reference to the drawings.

Figure 1:
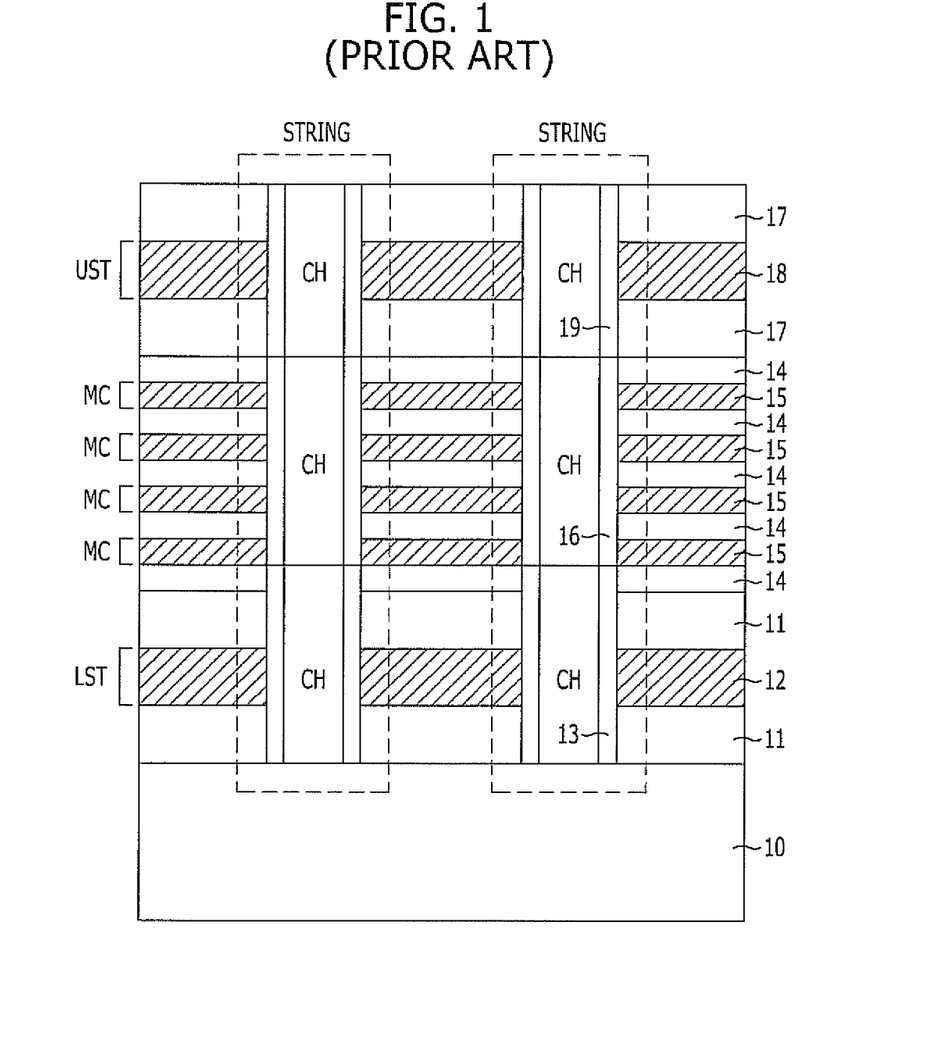
FIG. 1 is a cross-sectional view illustrating a structure of a conventional 3D non-volatile memory device having vertical channels, and a fabrication method thereof.

FIG. 1 is a cross-sectional view showing a structure of a conventional 3D non-volatile memory device having vertical channels, and a fabrication method thereof.

Referring to FIG. 1, a plurality of first inter-layer dielectric layers 11 and a first gate electrode 12 are formed over a substrate 10 having a source region defined therein, and a trench is formed to expose the surface of the substrate 10 by etching the first inter-layer dielectric layers 11 and the first gate electrode 12. Subsequently, after a first gate insulation layer 13 is formed on the internal walls of the trench, a channel CH is formed by filling the trench with a channel-forming layer. As a result, a lower select transistor LST is formed.

Subsequently, a plurality of second inter-layer dielectric layers 14 and a plurality of second gate electrode 15 are formed over the substrate structure where the lower select transistor LST is formed. Here, the number of the stacked second inter-layer dielectric layers 14 and the number of the stacked second gate electrode 15 are decided based on the number of memory cells to be stacked.

Subsequently, the plurality of the second inter-layer dielectric layers 14 and the plurality of the second gate electrode 15 are etched to form a trench that exposes a channel CH of the lower select transistor (LST). Subsequently, a charge blocking layer, a charge trapping layer, and a tunnel insulation layer (see reference numeral '16') are sequentially formed on the internal walls of the trench. As a result, a plurality of memory cells MC are formed.

Subsequently, a plurality of third inter-layer dielectric layers 17 and a third gate electrode 18 are formed over the plurality of the memory cells MC, and they are etched to form a trench that exposes a channel of a memory cell MC. Subsequently, a second gate insulation layer 19 is formed on the internal walls of the trench, and a channel CH is formed by filling the trench with a channel-forming layer. As a result, an upper select transistor (UST) is formed.

Here, the plurality of the memory cells MC are serially connected between the lower select transistor (LST) and the upper select transistor (UST) to form one string.

According to the above described conventional methods, the degree of integration may be improved over a conventional flat non-volatile memory device by arranging strings vertically from the substrate 10. When the strings are arranged vertically, the number of stacked memory cells may be increased to enhance the degree of integration even more, but such an increase in the number of stacked memory cells is becoming more difficult to achieve.

Further, according to the above described conventional methods, after a lower select transistor (LST) is formed, memory cells and an upper select transistor (UST) are sequentially formed. Thus, three steps are performed to form a string. Such steps complicate the fabrication process and increase production costs.

SUMMARY OF THE INVENTION

An embodiment of the present invention, which is devised to resolve the above problem, is directed to a non-volatile memory device of a three-dimensional (3D) structure having a U-shaped channel, and a method for fabricating the non-volatile memory device.

In accordance with an exemplary embodiment of the present invention, A non-volatile memory device having a pillar type channel comprising: substrate; a plurality of second channels of a pillar type formed over the substrate; a first channel formed in the substrate and coupled lower end portions of the plurality of the second channels with each other; and a plurality of control gate electrodes and a plurality of interlayer insulating layers stacked surrounding sidewalls of the plurality of the second channels.

In accordance with another exemplary embodiment of the present invention, A method of fabricating a non-volatile memory device having a pillar type channel, comprising: forming a first trench by etching a substrate; forming a first channel by filling a first channel material in the first trench; stacking a plurality of first material layers and a plurality of second material layers over the substrate filled with the first channel; forming a plurality of second trenches by etching the plurality of the first material layers and the plurality of the second material layer that expose the first channel; and forming a plurality of second channels by filling a second channel material in the plurality of the second trenches and coupled lower end portions of the plurality of the second channels with each other.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
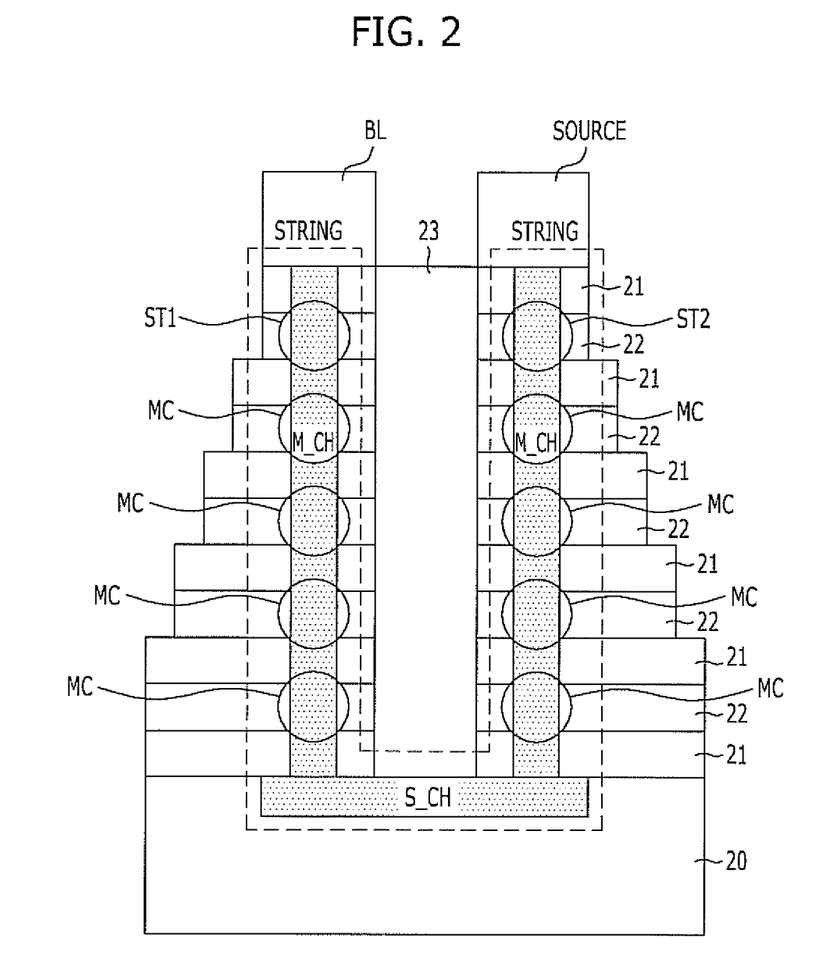
FIG. 2 is a cross-sectional view illustrating a structure of a three-dimensional (3D) non-volatile memory device in accordance with an exemplary embodiment of the present invention.

FIG. 2 is a cross-sectional view illustrating a structure of a three-dimensional (3D) non-volatile memory device in accordance with an exemplary embodiment of the present invention. Herein, layers not important for illustrating the invention are omitted.

As shown in the drawings, the 3D non-volatile memory device according to the exemplary embodiment of the present invention includes a plurality of memory cells MC stacked along a U-shaped channel, and a first select transistor ST1 and a second select transistor ST2 formed over the plurality of the memory cells MC which are stacked along the U-shaped channel.

Also, the 3D non-volatile memory device further includes a bit line BL and a source formed over the first select transistor ST1 and the second select transistor ST2, respectively. In other words, the bit line BL and the source are provided over the two upper select transistors ST1 and ST2 which constitute one string.

A plurality of inter-layer dielectric layers 21 and a plurality of control gate electrodes 22 are stacked over a substrate 20, and a U-shaped channel is buried in the inside of the stack of the inter-layer dielectric layers 21 and the control gate electrodes 22. The U-shaped channel includes main channels M_CH extended from the substrate 20 in a vertical direction and a sub-channel SCH formed in the lower portions of the main channels M_CH and coupling the adjacent main channels M_CH. In other words, the U-shaped channel is formed by using the sub-channel S_CH buried in the inside of the substrate 20 to couple at least two main channels M_CH which are extended from the substrate 20 with each other. The main channels M_CH have a shape of pillars which penetrate the inter-layer dielectric layers 21 and the control gate electrodes 22. The control gate electrodes 22 serve as word lines. The control gate electrodes 22 between the main channels M_CH are isolated, and an isolation insulation layer 23 is formed between the isolated control gate electrodes 22. Among the plurality of the control gate electrodes 22, the uppermost control gate electrode 22 becomes a select gate electrode of the select transistors ST1 and ST2. The upper end portions of the main channels M_CH are extended to penetrate the uppermost control gate electrode 22, which is the select gate electrode.

As described in the above, a string formed in a U shape may be formed by stacking a plurality of memory cells MC along the U-shaped channel, which includes the main channels M_CH and the sub-channel S_CH, and forming a select transistor over the plurality of the memory cells MC. The string has a structure that the plurality of the memory cells are serially coupled by the U-shaped channel, which includes the main channels M_CH and the sub-channel S_CH. When a string is formed in a U shape, the number of the memory cells MC included in a string may be increased by at least two times compared with the number of memory cells MC in a semiconductor memory device where strings are shaped as straight lines.

Also, since the memory cells MC are stacked along the U-shaped channel and the select transistors ST1 and ST2 are formed over the stack of the memory cells MC, the fabrication process may be simplified. Here, the select transistors ST1 and ST2 are formed at one time according to the exemplary embodiment of the present invention. Therefore, the fabrication process is simplified.

Moreover, since the select transistors ST1 and ST2 are formed over the plurality of the memory cells MC which are stacked along the U-shaped channel, a junction may be formed in the upper select transistors ST1 and ST2. Therefore, a non-volatile memory device having a 3D structure which operates in an enhanced mode may be formed, and the performance of the 3D non-volatile memory device may be improved.

FIGS. 3A to 3E are cross-sectional views describing a method for fabricating the 3D non-volatile memory device in accordance with a first exemplary embodiment of the present invention.

Figure 3A:
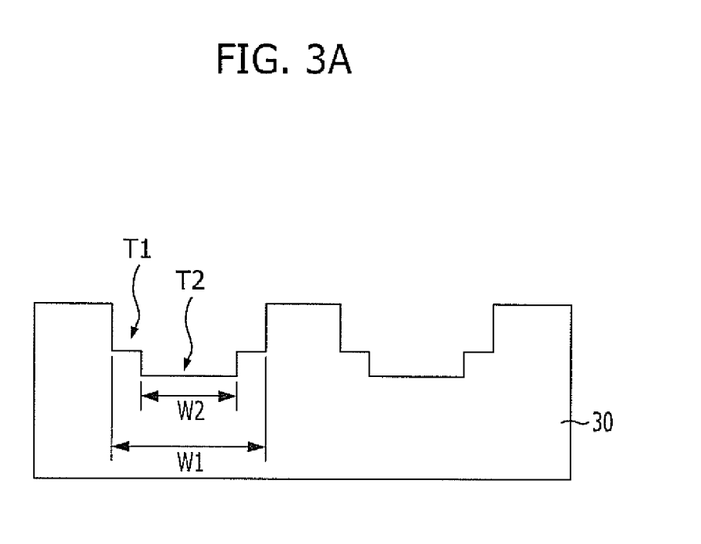
FIGS. 3A to 3E are cross-sectional views illustrating a method for fabricating the 3D non-volatile memory device in accordance with a first exemplary embodiment of the present invention.

Referring to FIG. 3A, a first trench is formed by etching a substrate 30. The first trench is filled with a sub-channel. Here, the first trench may be formed to have the same width in the upper portion and the lower portion or to have a wide width in the upper portion and a narrow width in the lower portion. For example, the first trench may include a first sub-trench T1 and a second sub-trench T2.

For example, after a first sub-trench T1 having a first width W1 is formed by etching the substrate 30, a second sub-trench T2 having a second width W2 which is narrower than the first width W1 of the first sub-trench T1 may be formed by etching a portion of the bottom of the first sub-trench T1. According to another example, after the second sub-trench T2 having the second width W2 is formed, the first sub-trench T1 having the first width W1 may be formed by increasing the width of the upper portion of the second sub-trench T2 through an isotropic etch process. Through the process, the first trench including the first sub-trench T1 and the second sub-trench T2 is formed.

Figure 3B:
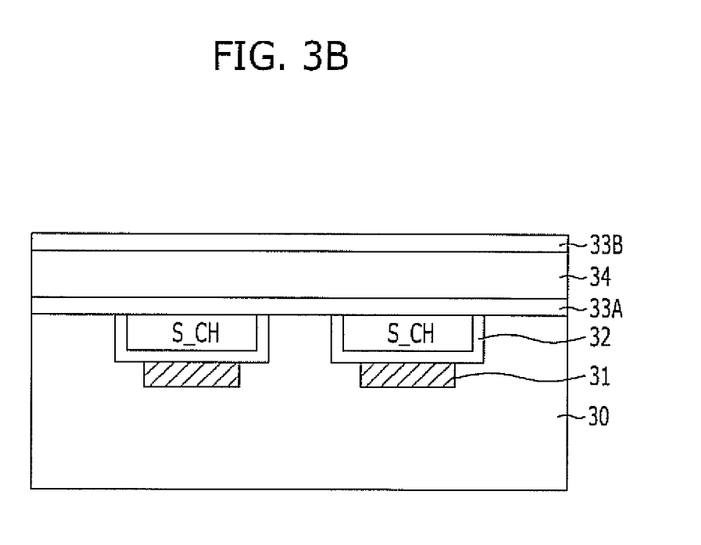

Referring to FIG. 3B, a bottom gate electrode 31 is formed by filling the second sub-trench T2 with a first conductive layer. A back gate insulation layer 32 is formed over the substrate structure with the bottom gate electrode 31. Subsequently, a sub-channel S_CH is formed by filling a channel layer in the inside of the first sub-trench T1 where the back gate insulation layer 32 is formed. Here, the bottom gate electrode 31 is formed to have a narrower width than the width of the sub-channel S_CH. The bottom gate electrode 31 includes a polysilicon layer. The sub-channel S_CH includes polysilicon layer.

As a result, a bottom transistor and the sub-channel S_CH are formed. The bottom transistor is a sort of a pass gate and it controls on/off of the sub-channel S_CH. Here, when the sub-channel S_CH is controlled to be turned on/off by applying a bias voltage to the bottom gate electrode 31 in the lower portion of the sub-channel S_CH, the substrate 30 may be damaged by the bias applied to the bottom gate electrode 31. Thus, it may be desirable to use a glass substrate or a plastic substrate as the substrate 30. The bottom transistor includes the sub-channel S_CH and the bottom gate electrode 31. The bottom gate electrode 31 may be also referred to as a back gate electrode. In this case, the bottom transistor may be referred to as a back gate transistor.

Alternatively, as illustrated in FIG. 2, the sub-channel S_CH may be formed by filling only the channel layer without forming the bottom gate electrode 31.

Subsequently, protective layers for protecting the sub-channel S_CH from being damaged during a subsequent process are formed over the sub-channel S_CH. The protective layers include a first etch stop layer 33A, a second etch stop layer 33B, and a buffer layer 34.

For example, when a subsequent etch process for forming a trench for isolating a word line is performed, the first and second etch stop layers 33A and 33B may be formed over the sub-channel S_CH to protect the sub-channel S_CH from being damaged. Also, to prevent a punch between memory cells MC which will be formed in a subsequent process and the sub-channel S_CH, the buffer layer 34 may be formed in a sufficient thickness. The buffer layer 34 includes an oxide layer.

According to another exemplary embodiment, the first and second etch stop layers 33A and 33B may be formed in the double layers in the upper and lower portions of the buffer layer 34 by sequentially forming the first etch stop layer 33A and the buffer layer 34 over the substrate 30 with the sub-channel S_CH formed therein and additionally forming the second etch stop layer 33B over the buffer layer 34. The first and second etch stop layers 33A and 33B include nitride layers, and the buffer layer 34 includes an oxide layer.

Figure 3C:
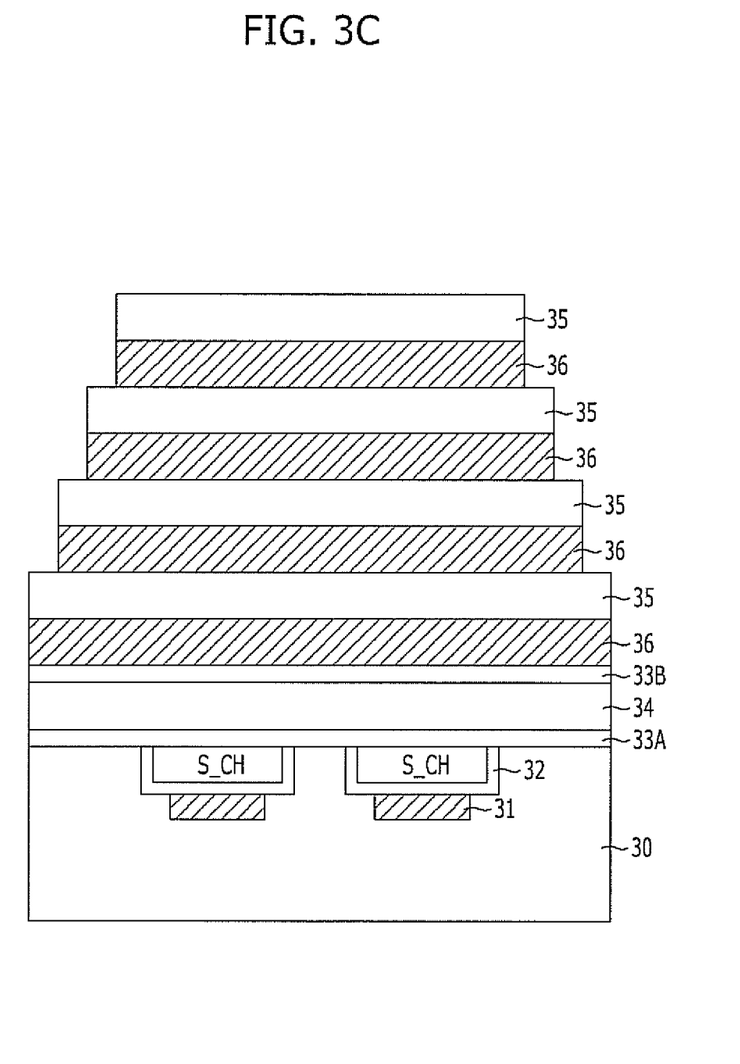

Referring to FIG. 3C, a plurality of first material layers 35 and a plurality of second material layers 36 may be alternately formed over the substrate 30 with the sub-channel S_CH.

Here, since the plurality of the first material layers 35 and the plurality of the second material layers 36 are used to form a plurality of memory cells, they may be formed of diverse materials according to a method for forming the memory cells. In one exemplary embodiment of the present invention, a case where the first material layers 35 are inter-layer dielectric layers and the second material layers 36 are second conductive layers is described. Here, the second conductive layers become control gate electrodes or word lines. The second conductive layers include polysilicon layers or metallic layers.

Here, the inter-layer dielectric layers are isolation layers for isolating stacked memory cells one from another, and the number of the second conductive layers that are stacked may equal the number of the memory cells to be stacked.

According to the exemplary embodiment of the present invention, an inter-layer dielectric layer does not need to be formed in the lower portion of the conductive layer for forming a word line and for being deposited over the first and second etch stop layers 33A and 33B or the buffer layer 34, which are formed over the substrate 30.

Subsequently, the plurality of the first material layers 35 and the plurality of the second material layers 36 are etched to expose the surface of each second material layer 36. For example, the plurality of the first material layers 35 and the plurality of the second material layers 36 may be patterned in such a manner that the ends of the plurality of the first material layers 35 and the plurality of the second material layers 36 form a stair-like structure. The process of forming the stair-like structure is referred to as a slimming process.

Figure 3D:
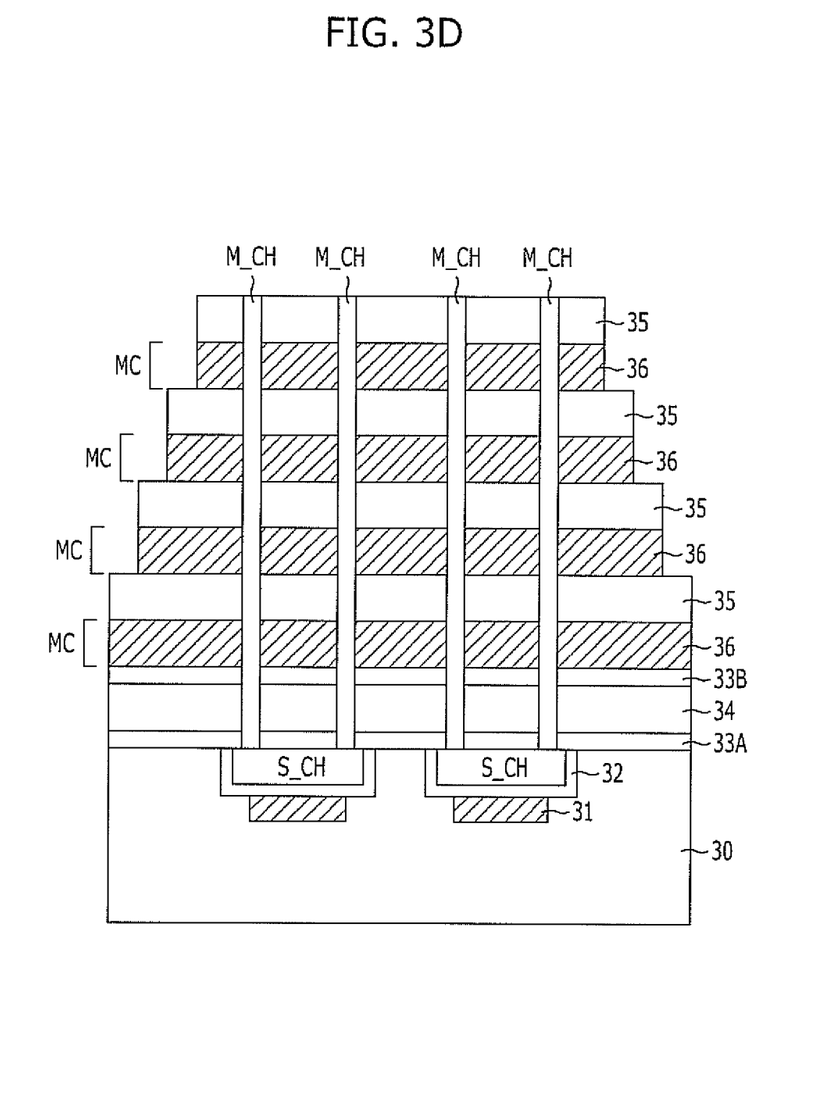

Referring to FIG. 3D, a plurality of second trenches which expose the surface of the sub-channel S_CH in at least two spots are formed by etching the plurality of the first material layers 35 and the plurality of the second material layers 36. The plurality of the second trenches are to be filled with main channels subsequently.

Subsequently, a charge blocking layer, a charge capturing layer, and a tunnel insulation layer (not shown) are sequentially formed on the internal wall of the second trenches.

Here, the charge blocking layer prevents charges from penetrating through the charge capturing layer and leaking to a word line. The charge capturing layer is used as a substantial data storage, and the charge capturing layer is divided into a charge storage layer which stores charges in a conductive band and a charge trapping layer which traps charges in a deep potential trap site. The tunnel insulation layer is provided as an energy barrier against the tunneling of charges.

Subsequently, a plurality of main channels M_CH coupled with the sub-channel S_CH are formed by filling a channel layer in the second trenches. The main channels M_CH include polysilicon layers. Through the process, at least two main channels M_CH are coupled with each other by a sub-channel S_CH so that a U-shaped channel including the sub-channel S_CH and the main channels M_CH is formed. Here, the main channels M_CH coupled by the sub-channel S_CH constitute one string. As a result, a plurality of memory cells MC stacked along the U-shaped channel are formed.

Figure 3E:
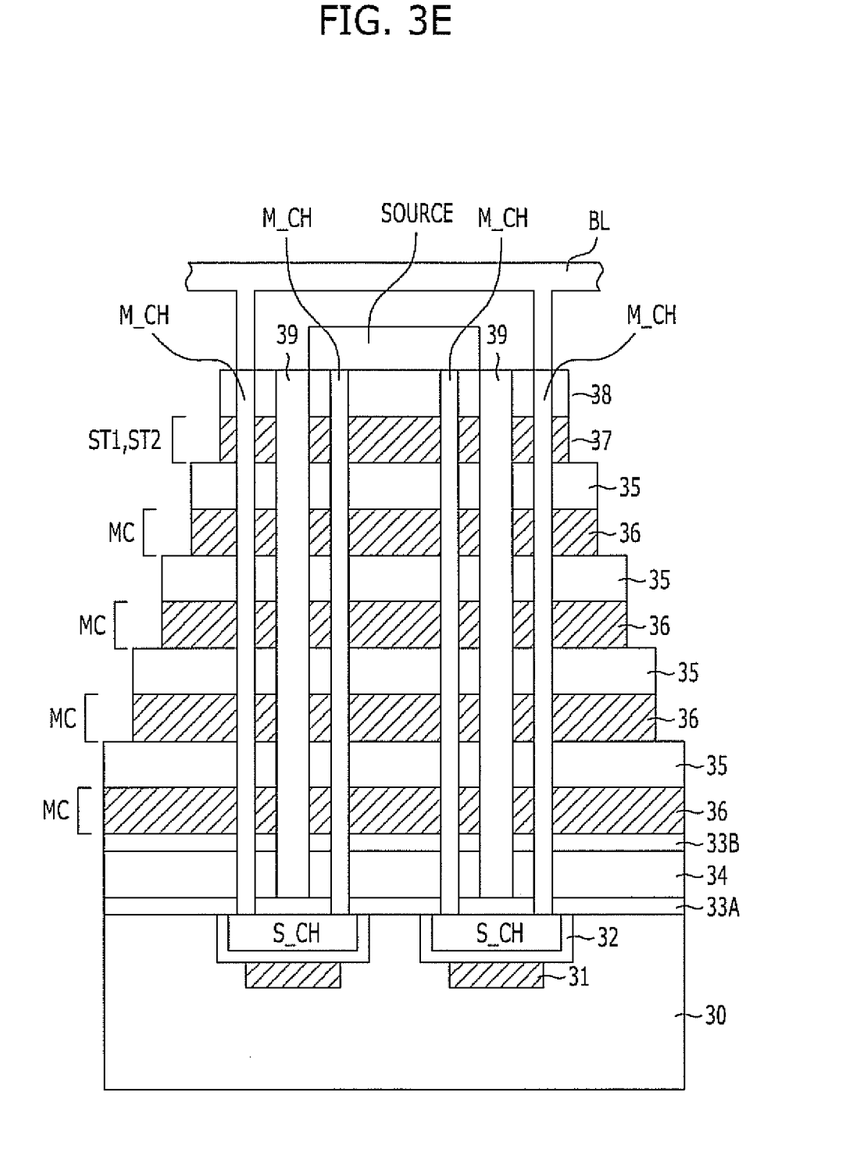

Referring to FIG. 3E, select transistors ST1 and ST2 including a select gate electrode 37 are formed over the plurality of the memory cells MC. A third conductive layer 37 and an inter-layer dielectric layer 38 are formed over the plurality of the memory cells MC to form the select transistors ST1 and ST2. The third conductive layer 37 includes a polysilicon layer. Subsequently, a third trench exposing a surface of the main channel M_CH of the memory cells MC is formed by etching the inter-layer dielectric layer 38 and the third conductive layer 37. Subsequently, a gate insulation layer (not shown) is formed on the internal wall of the third trench, and a channel of the select transistors is formed by filling a channel layer in the inside of the third trench. The channel of the select transistors is arranged so that it is extended from the upper end portions of the main channels M_CH.

As a result, the select transistors ST1 and ST2 are formed over the plurality of the memory cells MC stacked along the U-shaped channel. In other words, in case of the U-shaped channel, since both ends of the channel are exposed in the uppermost portion, the two select transistors ST1 and ST2 coupled to respective ends of the channel may be simultaneously formed at one time. As a result, a string including the plurality of the memory cells MC stacked along the U-shaped channel and the select transistors ST1 and ST2 formed over the plurality of the memory cells MC is formed.

Subsequently, a mask pattern (not shown) which exposes the space between the main channels M_CH coupled by a sub-channel S_CH is formed over the substrate structure where the select transistors ST1 and ST2 are formed. Then, the plurality of the first material layers 35 and the plurality of the second material layers 36 are etched using the mask pattern as an etch barrier. Through the process, the first material layers 35 and the second material layers 36 between the main channels M_CH coupled by the sub-channel S_CH are etched so as to form a fourth trench. When the second material layers 36 are word lines, the fourth trench becomes a trench for isolating the word lines one from another. The process of forming the fourth trench is referred to as a slit process.

Subsequently, before filling an isolation insulation layer 39 in the fourth trench, the second material layers 36, which are exposed by the fourth trench, may be silicided. For example, it is desirable to silicide the sidewalls of the second material layers 36 by filling the fourth trench with a metallic layer and performing a thermal treatment. The silicidation process is appropriate when the second material layers 36 are metallic layers. Subsequently, the fourth trench is filled with the isolation insulation layer 39. The isolation insulation layer 39 includes an oxide layer. As a result, word lines of the memory cells MC formed in the same layer among the plurality of the memory cells MC constituting a string are isolated one from another.

Alternatively, since a source and a bit line are formed over the select transistors ST1 and ST2 respectively through a subsequent process, the word line isolation process may not be performed. However, when the word line isolation process is performed, the surface resistance $R_S$ of a word line is decreased and the resistance of the word line may be decreased even more by performing a silicidation process.

Subsequently, a source and a bit line BL are formed over the select transistors ST1 and ST2, respectively. Here, the source is formed over one of the main channels M_CH included in the U-shaped channel, and the bit line BL is formed over the other main channels M_CH. In other words, between the two select transistors ST1 and ST2 constituting one string, one is coupled with the source, and the other is coupled with the bit line BL. Therefore, a read/write operation may be performed for each desired page.

Here, the source may be formed to be coupled with the upper portions of the select transistors ST1 and ST2 of adjacent strings. In other words, adjacent strings may be formed to share the source. Also, the bit line BL has a pattern of a plurality of lines extended in parallel, and the line patterns are coupled with the select transistors of the strings that are arranged in a desired direction.

Figure 4A:
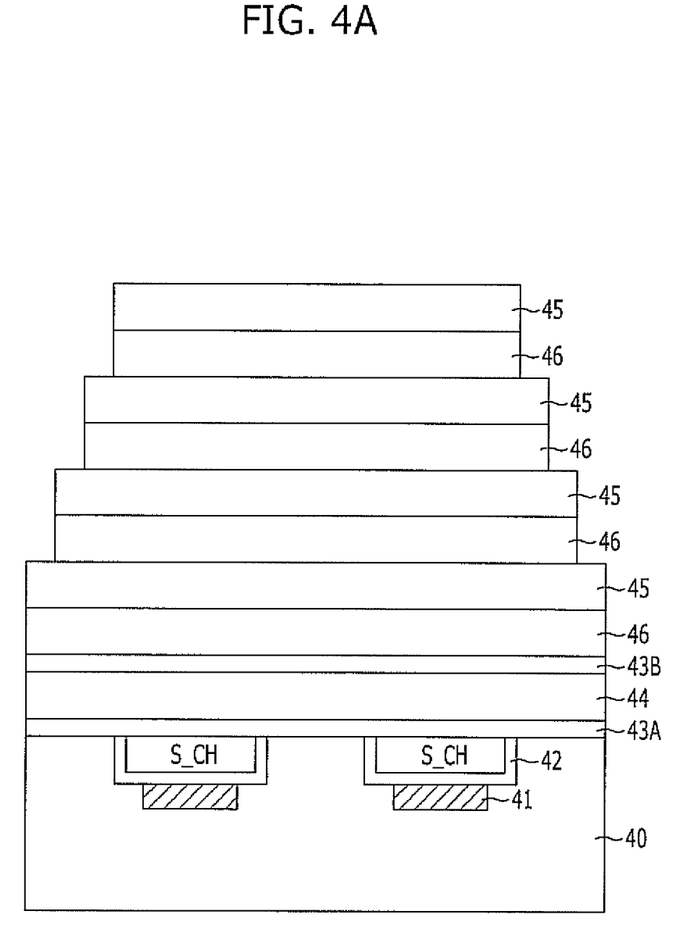
FIGS. 4A to 4C are cross-sectional views illustrating a method for fabricating the 3D non-volatile memory device in accordance with a second exemplary embodiment of the present invention.
Figure 4B:
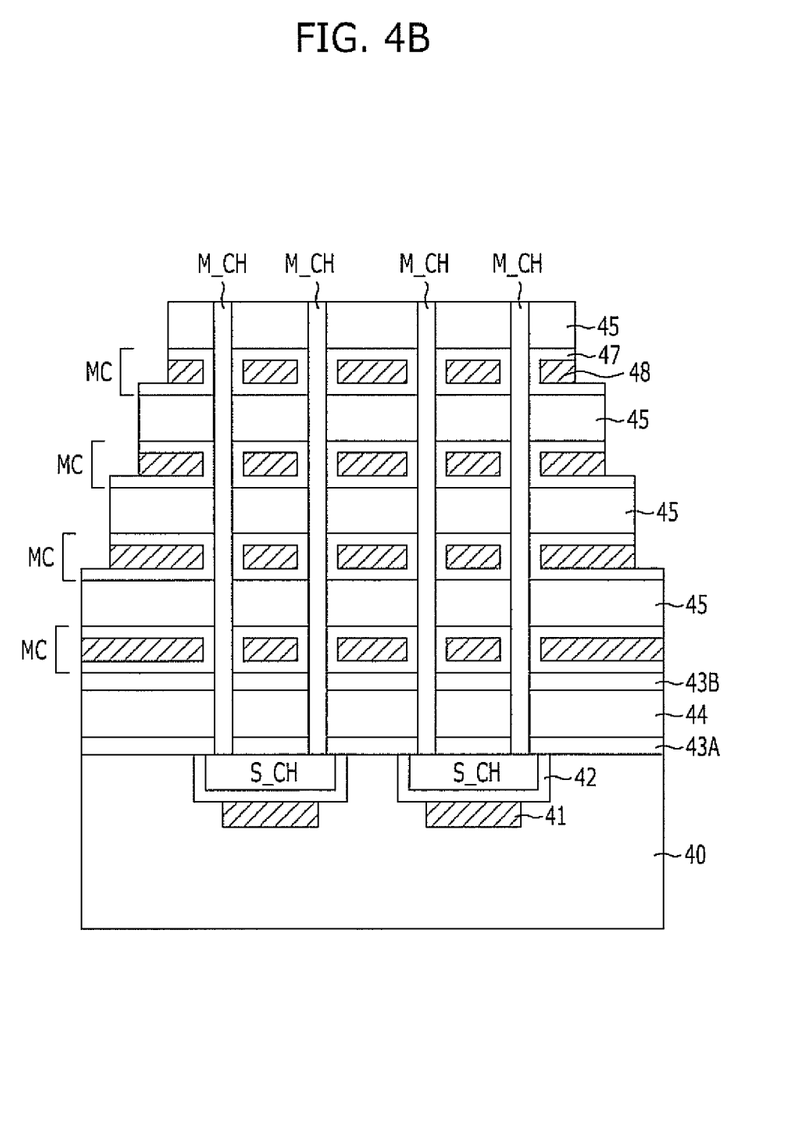
Figure 4C:
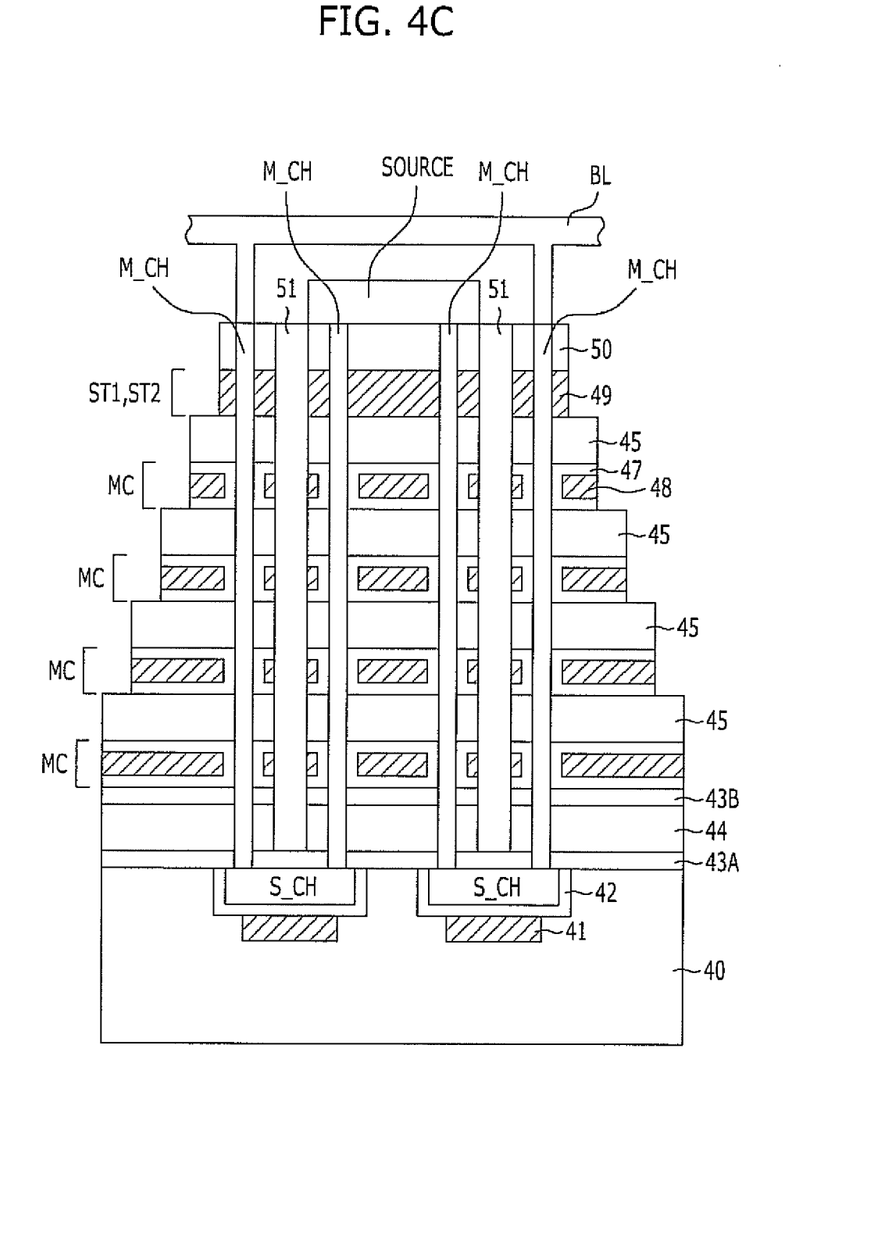

FIGS. 4A to 4C are cross-sectional views describing a method for fabricating the 3D non-volatile memory device in accordance with a second exemplary embodiment of the present invention.

Referring to FIG. 4A, a first trench for forming a sub-channel is formed by etching a substrate 40. Then, a bottom gate electrode 41 and a gate insulation layer 42 are formed in the first trench, and then a sub-channel S_CH is formed by filling a channel layer in the trench. Subsequently, a first etch stop layer 43A, a buffer layer 44, and a second etch stop layer 43B are formed as protective layers for protecting the sub-channel S_CH from being damaged.

Subsequently, a plurality of first material layers 45 and a plurality of second material layers 46 are alternately formed over the substrate structure where the sub-channel S_CH is formed. In this exemplary embodiment, the plurality of the first material layers 45 are inter-layer dielectric layers and the plurality of the second material layers 46 are sacrificial layers.

Here, the sacrificial layers 46 are used to secure space for forming a tunnel insulation layer, a charge capturing layer, a charge blocking layer, and a word line in subsequent processes. The sacrificial layers 46 may be formed of a material having a great etch selectivity with respect to the inter-layer dielectric layers. For example, when the inter-layer dielectric layers 45 are oxide layers, the sacrificial layers 46 may be nitride layers.

Subsequently, a plurality of second trenches for forming main channels are formed to expose the surface of the sub-channel S_CH in at least two spots by etching the plurality of the first material layers 45 and the plurality of the second material layers 46.

Subsequently, a plurality of main channels M_CH which are extended from the substrate 40 in the vertical direction and coupled by the sub-channel S_CH are formed by filling a channel layer in the second trenches.

Here, a dummy pillar (not shown) penetrating through the plurality of the first material layers 45 and the plurality of the second material layers 46 may be formed together when the main channels M_CH are formed in order to prevent remaining first material layers 45 from being collapsed during a subsequent process for removing the second material layers 46.

Referring to FIG. 4B, while the first material layers 45 remain, the second material layers 46 are selectively removed. Accordingly, undercuts exposing the sidewalls of the main channels M_CH at a desired interval are formed between the first material layers 45. Here, as described before, the dummy pillar penetrating through the plurality of the first material layers 45 and the plurality of the second material layers 46 may protect the remaining first material layers 45 from being collapsed.

Subsequently, a tunnel insulation layer, a charge capturing layer, and a charge blocking layer (together "47") are sequentially formed on the sidewalls of the main channels M_CH, which are exposed at the predetermined interval. In the drawing, the tunnel insulation layer, the charge capturing layer, and the charge blocking layer are shown as one layer for illustration purposes.

Subsequently, a control gate electrode 48 is formed over the tunnel insulation layer, the charge capturing layer, and the charge blocking layer 47. In other words, the control gate electrode 48 fills the undercut and surrounds the main channels M_CH. The control gate electrode 48 serves as a word line. When control gate electrode 48 is formed between the first material layers 45, multiple control gate electrodes 48 are formed.

As a result, a region opened between the first material layers 45 is filled with the tunnel insulation layer, the charge capturing layer, and the charge blocking layer 47 and the conductive layer 48, and a plurality of memory cells MC stacked along the U-shaped channel are formed.

Referring to FIG. 4C, a third trench which exposes the surface of the main channels M_CH of the memory cells MC is formed by forming a select gate electrode 49 and an inter-layer dielectric layer 50 over the plurality of the memory cells MC and etching the conductive line 49 for forming a select line and the inter-layer dielectric layer 50. Subsequently, a gate insulation layer (not shown) is formed on the internal wall of the third trench and channels for select transistors ST1 and ST2 are formed by filling a channel layer in the trench. As a result, select transistors ST1 and ST2 are formed.

Subsequently, a fourth trench is formed to isolate the control gate electrode 48 by etching the layers between the main channels M_CH coupled by the sub-channel S_CH, and then the fourth trench is filled with an isolation insulation layer 51.

Subsequently, a source and a bit line BL are formed over the select transistors ST1 and ST2 respectively.

According to the technology of the present invention, a non-volatile memory device of a 3D structure having a U-shaped channel may be fabricated by forming main channels extended from a substrate in the vertical direction and a sub-channel coupling adjacent main channels so as to form the U-shaped channel. In this way, the number of memory cells included in one string may be increased by twice or more.

Also, since a plurality of memory cells are formed and a select transistor is formed over the plurality of the memory cells, the fabrication process may be simplified and a separate process for forming a lower select transistor and an upper select transistor may be avoided. Therefore, production costs may be reduced.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device having a pillar type channel comprising:
   a substrate;
   a plurality of second channels of a pillar type formed over the substrate;
   a first channel formed in the substrate and coupled lower end portions of the plurality of the second channels with each other;
   a plurality of control gate electrodes and a plurality of interlayer insulating layers stacked surrounding sidewalls of the plurality of the second channels; and
   a back gate electrode formed in the substrate at a bottom surface of the first channel,
   wherein a width of the back gate electrode is narrower than that of the first channel.

2. The non-volatile memory device of claim 1, further comprising:
   a back gate insulation layer formed between the back gate electrode and the first channel.

3. The non-volatile memory device of claim 2, wherein the substrate is a glass substrate or a plastic substrate.

4. The non-volatile memory device of claim 1, further comprising:
   a plurality of select gate electrodes formed over a uppermost interlayer insulating layer.

5. The non-volatile memory device of claim 4, further comprising:
   a source line coupled to an upper end portion of a portion of the plurality of the second channels;
   a bit line coupled to upper end portions of the remaining portion of the plurality of the second channels.

6. The non-volatile memory device of claim 1, further comprising:
   a protective layer configured between the substrate and a lowermost control gate electrode.

7. The non-volatile memory device of claim 6, wherein the protection layer is stacked layer with a first etch stop layer, a buffer layer, and a second etch stop layer.

8. The non-volatile memory device of claim 7, wherein the first and the second etch stop layer is a nitride layer and the buffer layer is oxide layer.

9. The non-volatile memory device of claim 1, further comprising:
   a tunnel insulating layer, charge trapping or storage layer, and charge blocking layer formed over the sidewalls of the plurality of the second channels.

10. The non-volatile memory device of claim 1, further comprising:
    a tunnel insulating layer, charge trapping or storage layer, and charge blocking layer formed over the sidewalls of the plurality of second channels surrounding the plurality of gate electrodes.

* * * * *